United States Patent
Zelner et al.

(10) Patent No.: US 9,404,175 B2
(45) Date of Patent: Aug. 2, 2016

(54) METHOD OF FORMING A TARGET FOR DEPOSITION OF DOPED DIELECTRIC FILMS BY SPUTTERING

(71) Applicant: BLACKBERRY Limited, Waterloo (CA)

(72) Inventors: Marina Zelner, Burlington (CA); Andrew Vladimir Claude Cervin, Oakville (CA)

(73) Assignee: BlackBerry Limited, Waterloo, ON ( * ) Notice: Subject to any disclaimer, the term of this patent is extended or adjusted under 35 U.S.C. 154(b) by 469 days.

(21) Appl. No.: 13/757,999

(22) Filed: Feb. 4, 2013

(65) Prior Publication Data

US 2014/0216921 A1   Aug. 7, 2014

(51) Int. Cl.
  *C23C 14/00* (2006.01)
  *C23C 14/34* (2006.01)
  *C23C 14/08* (2006.01)

(52) U.S. Cl.
  CPC ........... *C23C 14/3414* (2013.01); *C23C 14/083* (2013.01)

(58) Field of Classification Search
  CPC .......................... C23C 14/3414; C23C 14/083
  See application file for complete search history.

(56) References Cited

U.S. PATENT DOCUMENTS

| | | | |
|---|---|---|---|
| 6,562,715 B1 * | 5/2003 | Chen et al. | 438/643 |
| 6,585,951 B1 | 7/2003 | Hong et al. | |
| 8,154,850 B2 | 4/2012 | Zelner et al. | |
| 2003/0073565 A1 | 4/2003 | Ellis et al. | |
| 2003/0119656 A1 | 6/2003 | Chiu et al. | |
| 2004/0228968 A1 | 11/2004 | Basceri | |
| 2006/0159950 A1 * | 7/2006 | Kunisada et al. | 428/689 |
| 2007/0093059 A1 * | 4/2007 | Basol | 438/687 |
| 2007/0117237 A1 * | 5/2007 | Inoue | 438/30 |
| 2007/0144573 A1 * | 6/2007 | Mihara et al. | 136/205 |
| 2008/0152530 A1 | 6/2008 | Yu et al. | |
| 2011/0114481 A1 | 5/2011 | Satoh et al. | |
| 2011/0212382 A1 | 9/2011 | Randall et al. | |
| 2011/0250126 A1 | 10/2011 | Ivanov et al. | |
| 2012/0147524 A1 | 6/2012 | Okamoto et al. | |
| 2012/0251714 A1 | 10/2012 | Miller et al. | |

* cited by examiner

*Primary Examiner* — Keith Hendricks
*Assistant Examiner* — Timon Wanga
(74) *Attorney, Agent, or Firm* — Guntin & Gust, PLC; Ralph Trementozzi

(57) ABSTRACT

A system that incorporates teachings of the subject disclosure may include, for example, a method in which a selection is made for a first major constituent, a second major constituent and a minor constituent for forming a desired material. The method can include mixing the first major constituent, the second major constituent and the minor constituent in a single mixing step to provide a mixture of constituents. The method can include drying the mixture of constituents to provide a dried mixture of constituents and calcining the dried mixture of constituents to provide a calcinated mixture of constituents. The method can include processing the calcinated mixture of constituents to provide a powder of constituents. Other embodiments are disclosed.

12 Claims, 3 Drawing Sheets

100

150

200

250

| Parameter | Insulating Target | Contemporary Hot-pressed Target | Sputtering Target of FIG. 2A |
|---|---|---|---|
| Density | 70 to 75% | 96.00% | 99.00% |
| Deposition rate (nm/min) | 4.2 nm/min | 9.0 nm/min | 12 - 18 nm/min |

*Table of comparisons between targets fabricated with different methods*

FIG. 2C

METHOD OF FORMING A TARGET FOR DEPOSITION OF DOPED DIELECTRIC FILMS BY SPUTTERING

FIELD OF THE DISCLOSURE

The subject disclosure relates to a method of forming and utilizing sputtering targets.

BACKGROUND

Dielectric thin films can be deposited for the purpose of fabricating electronic components by a variety of methods. One of these methods is physical vapor deposition (PVD) from a target of the desired material, otherwise known as sputtering. The sputtering method is known to people skilled in the art of thin-film deposition for the deposition of the conductive or semiconducting films (metals or conductive barriers). The method could be utilized also for the deposition of dielectrics. The sputtering process is utilizing cathode plasma discharge in vacuum resulting in the material transfer from the target to a substrate. The deposition can be done in an inert plasma sustaining gas ambient or in a reactive gas ambient, such as an inert/reactive gas mixture. Argon is frequently used as the inert plasma sustaining gas. Oxygen is a frequently used reactive gas for the deposition of oxide films. Other reactive gases such as nitrogen, nitrous oxide, etc. can be used as well. The quality of the thin dielectric film is heavily dependent on the quality and structure of the target material. Any impurities or trapped gases in the target are incorporated into the thin film, usually causing degradation of the film performance. The rate at which material is ejected from the target is also influenced by the target composition and density. A denser target can withstand higher power and have a resulting higher deposition rate and productivity of the fabrication process. Thus, the target quality and density will determine the film quality and productivity of the process. One of the challenges in fabrication of the target with a doped composition is the fact that the minor constituents (dopants) are added in substantially lower amounts (~0.5-10% of the major constituents). If the dopants are not evenly distributed, they create local areas with different dielectric strength and density. If the dopants have multiple valent states, the uneven distribution of dopants will lead to generation of large pores, craters, or even blisters. Even distribution of the minor constituents in the composition is a key to the dielectric strength of the target, particulate control, and deposition rate of the sputtering process. Attempting to improve the distribution of the minor constituents by longer mechanical mixing/milling step results in micro-contamination of the target material with trace elements worn off the contacting parts.

In FIG. 1A, a sputtering target 100 is shown for a doped Barium-Strontium-Titanate (BST) formulation that was fabricated using a hot-press method with standard powders. The powders were prepared from calcined barium titanate powder and other standard pre-cursors using a conventional two-step method of mixing+calcination then re-mixing with dopant powders. This target using standard oxide powders is non-usable because of the heavy blistering of the material. If the hot-press process for forming the sputtering target is optimized or otherwise improved to reduce or eliminate the blistering then the grain size distribution 150 becomes too high, density of the sputtering target becomes low (e.g., <96% of the theoretical density) and the sputtering target material is porous as shown in FIG. 1B.

BRIEF DESCRIPTION OF THE DRAWINGS

Reference will now be made to the accompanying drawings, which are not necessarily drawn to scale, and wherein:

FIG. 2C depicts a table for comparison of density and deposition rate between a high-K dielectric sputtering target of the exemplary embodiments and prior art sputtering targets formed from prior art hot-press processes.

DETAILED DESCRIPTION

Figure 1A:
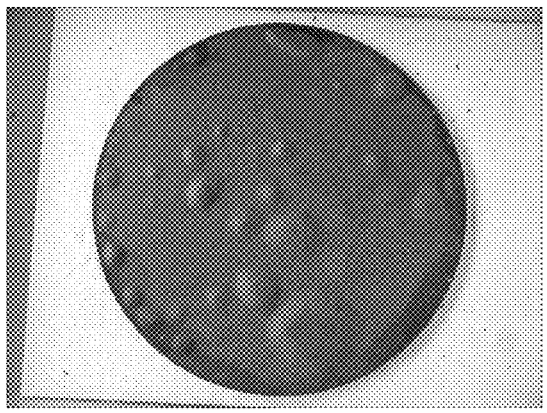
FIGS. 1A and 1B depict a prior art high-K dielectric sputtering target and prior art non-uniform grain size distribution for the prior art high-K dielectric sputtering target formed from a contemporary hot-press fabrication process.
Figure 1B:
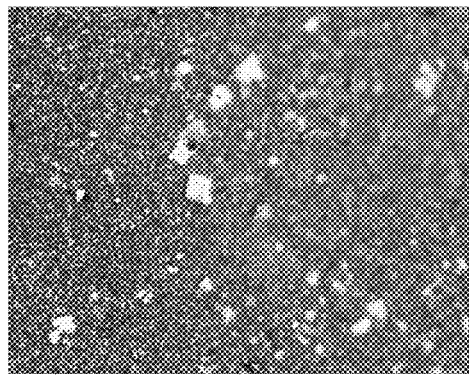

The subject disclosure describes, among other things, illustrative embodiments of a sputtering target and a method of forming the sputtering target to enable fabrication of desired electrical or optical components, such as components that include high-K dielectric thin film(s). In one or more embodiments, the composition includes major and minor constituents. In one or more embodiments, the sputtering target can be used in a PVD process that enables a higher deposition rate (e.g., greater than 9 nanometers per minute). In one or more embodiments, the sputtering target can have a higher density (e.g., at least 99% of the theoretical density). In one or more embodiments, the sputtering target can be used in a PVD process to form a BST layer, such as for use in a variable capacitor. In one or more embodiments, the process allows application of higher power to the target than previously possible with more standard targets with a consequent increase in the productivity of the deposition process and therefore increased capacity and reduced manufacturing cost. In one or more embodiments, the process allows one mixing step to significantly reduce contamination from the mixing step in the final sputtering target.

Other references, such as U.S. Pat. Nos. 8,154,850, and 7,224,040 which are hereby incorporated by reference, have shown how to fabricate fixed and tunable capacitors using dielectric thin films deposited by the sputtering method. Electronic and optical devices other than capacitors can also be fabricated with dielectric films deposited by the sputtering method. Examples include, but are not limited to: non-volatile memories, film bulk acoustic resonators (FBAR) for filtering and signal processing, anti-reflection coatings for lenses and waveguides for integrated optics. Other references demonstrate the advantages of using doped oxide formulations in electronic devices: U.S. Pat. Nos. 6,683,516, 6,876,279, 6,774,077, 6,905,989, 7,297,650, which are hereby incorporated by reference. For example as described in U.S. Pat. No. 7,224,040, a thin film capacitor can be formed that includes a substrate; and a dielectric layer between at least two electrode layers, where the electrode layers are formed from a conductive thin film material. A buffer layer between the substrate and the dielectric layer can be used where the buffer layer has a smooth surface with a surface roughness (Ra) less than or equal to 0.08 micrometers (um). The thin film capacitor can include a High Density Interconnect (HDI) layer between the substrate and the buffer layer. The HDI layer can include at least one routing layer and at least one layer of a thick film dielectric material. The HDI layer can also include one or more metal filled vias to electrically connect the dielectric layer to metal filled through holes in the substrate. The HDI layer can also include one or more buried passive circuit components. The thin film capacitor can include an adhesion layer between the buffer layer and the dielectric layer. The adhesion layer can include on or more layers of thin film TiOx. The adhesion layer can include one or more layers of thin film $Al_2O_3$.

In one or more embodiments, the precursors for forming the sputtering target, such as major and minor constituents, can be selected based on thermal decomposition properties. In one embodiment, some or all of the thermally decomposable precursors for the major constituents can be selected based on their material properties of being thermally decomposable at a temperature of equal to or lower than 60% of the final crystallization temperature of the resulting powder. In one or more embodiments, thermal decomposition of such components can occur at an equal or lower temperature than the temperature of a solid state reaction forming the given composition.

In one or more embodiments, the minor constituents can be amorphous or near-amorphous, including nanopowders, gels, and/or alkoxides. In one or more embodiments, the major and minor constituents can be mixed in a single mixing step and then processed (e.g., drying, calcining, pulverizing, and/or sieve separating) so that a resulting powder can be hot-pressed to form a desired sputtering target. Other embodiments are contemplated by the subject disclosure.

One embodiment of the subject disclosure can be a method including selecting a first major constituent, a second major constituent and a minor constituent. The first major constituent can be selected from a group consisting essentially of $TiO_2$, $Ta_2O_5$, $Nb_2O_5$, or $ZrO_2$. The second major constituent can be selected from a group consisting essentially of a carbonate or a carboxylate (acetate, oxalate, formicate) or combination thereof. The minor constituent can be selected from a group consisting essentially of a nanopowder, a gel, an alkoxide or combinations thereof. The method can include mixing the first major constituent, the second major constituent and the minor constituent in a single mixing step to provide a mixture of constituents. The mixing could be dry or wet. The method can include drying the mixture of constituents to provide a dried mixture of constituents, and calcining the dried mixture of constituents to provide a fully reacted crystalline material of the given composition. The method can include pulverizing and sieve separating the reacted material to provide a precursor powder. The reacted crystalline powder of the given composition and of the certain grain size is a precursor material for the hot press or the isostatic cold press formation of a sputtering target.

One embodiment of the subject disclosure can be a method that includes selecting a major constituent and a minor constituent. The major constituent can be selected from a group of major constituents that have a thermal decomposition temperature of 50% to 60% of the final crystallization temperature of a powder of constituents. The minor constituent can be selected from a group of minor constituents that are amorphous. The method can include mixing the major constituent and the minor constituent in a single mixing step to provide a mixture of constituents. The method can include drying the mixture of constituents to provide a dried mixture of constituents, and calcining the dried mixture of constituents to provide a fully reacted mixture of constituents. The method can include milling or pulverizing the calcinated mixture of constituents to provide the powder of constituents. The grain size distribution and thermal stability of this powder is configured for being hot-pressed to form a compositionally uniform and dense sputtering target.

One embodiment of the subject disclosure can be a method that includes selecting a first major constituent, a second major constituent and a minor constituent for forming a high-K dielectric material. The method can include mixing the first major constituent, the second major constituent and the minor constituent in a single mixing step to provide a mixture of constituents. The method can include drying the mixture of constituents to provide a dried mixture of constituents and calcining the dried mixture of constituents to provide a fully reacted mixture of constituents. The method can include milling or pulverizing the reacted mixture of constituents to provide a powder of constituents. The powder of constituents is configured for being hot-pressed to form a sputtering target for use in a physical vapor deposition process to form the dielectric material at a deposition rate of at least twelve nanometers per minute.

Figure 2A:
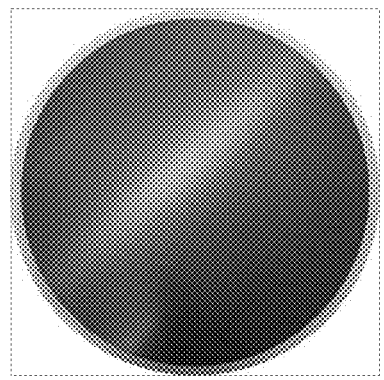
FIGS. 2A and 2B depict an illustrative embodiment of a high-K dielectric sputtering target and grain size distribution for the high-K dielectric sputtering target formed from a fabrication process according to the exemplary embodiments.
Figure 2B:
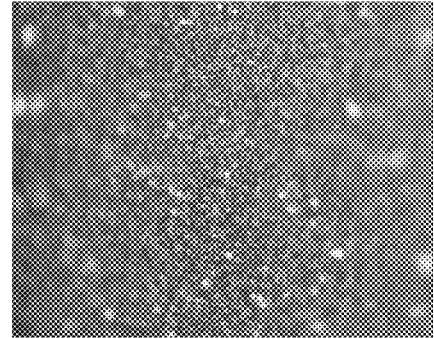

Referring to FIGS. 2A and 2B, a sputtering target 200 and corresponding grain structure 250 is shown for a sputtering target fabricated according to the exemplary embodiments. The grain structure 250 shows small and uniform grains for the sputtering target 200 as is desired. In one or more embodiments, the sputtering target can be used to deposit films at between 9 and 18 nm/min. Referring to FIG. 2C, a comparison with enabled deposition rates for other sputtering targets is illustrated. As can be seen, the insulating target can only manage 4.2 nm/min maximum deposition rate and the sputtering target with a large grain-size distribution 150 can only be used up to 9 nm/min. This represents a large increase in the productivity of the deposition process with consequent cost reduction for the eventual product and capacity increase for the manufacturing facility.

Sputtering target 200 can be formed through a process that selects particular precursor materials for forming a powder. The materials can be selected based on various criteria, including thermal decomposition properties, such as a particular thermal decomposition temperature (e.g., of <50-60% of the final crystallization temperature of the resulting powder—although other thermal decomposition temperatures (or ranges of temperatures) can be utilized). Other criteria can include structure, such as amorphous or near amorphous structure of the precursor.

In one embodiment, all of the thermally decomposable precursors for the major constituents are thermally decomposable at a temperature of 50-60% of the final crystallization temperature of powder. In another embodiment, the thermal decomposition of all of the decomposable precursors for the major constituents occurs at an equal or lower temperature than the temperature of the solid state reaction forming the major constituent(s). In one or more embodiments, more than one major constituent and at least one minor constituent is utilized in forming the sputtering target.

In one or more embodiments, the major constituent(s) for the sputtering target 200 can include thermally decomposable precursor(s) of one or more of metal carbonates and carboxylates (such as oxalates or acetates). In one or more embodiments, the minor constituent(s) for the sputtering target 200 can include liquids (such as sols, gels, and/or alkoxides) or solids (such as xero-gels, anhydrous amorphous precipitates, and/or nanopowders).

For example, nanopowder precursors for the minor constituents can include metal oxide nanopowders including rare-earth metal oxide, hydroxide, titanate, zirconate, and/or niobate nanopowders. As another example, sol-gel or gel chemically derived precursors for the minor constituents can include metal titanate, tantalite, niobate, zirconate sols and gels both in organic solvents or aqueous. As another example, alkoxides and partially hydrolyzed alkoxides for the minor constituents can include metal alkoxides such as (but not limited to) magnesium ethoxide, aluminum isopropoxide and/or rare-earth alkoxides. As another example, partially hydrolyzed alkoxides can also include hydroxyacetates, hydroxyoxalates or hydroxypropionates.

As another example, hydroxides for the minor constituents can include magnesium hydroxide, aluminum hydroxide, and so forth. As another example, carboxylates include acetates, formciates, oxalates or propionates (both hydrated and anhydrous). In one or more embodiments, any metal alkoxide (except of alkoxides of the group 1 metals) can be used in the partly hydrolyzed form.

In one or more embodiments, the major and minor constituents for sputtering target 200 can be combined in a one-step mixing of all the precursors. A calcination can be performed at a temperature selected for the mixture that provides a desired grain size, such as a calcination temperature of 1200° C. for a BST powder. Other precursors and constituents can be used for forming sputtering targets which can result in other calcination temperatures being implemented, such as utilizing other titanate-based powders where a lower calcination temperature is utilized.

Figure 3:
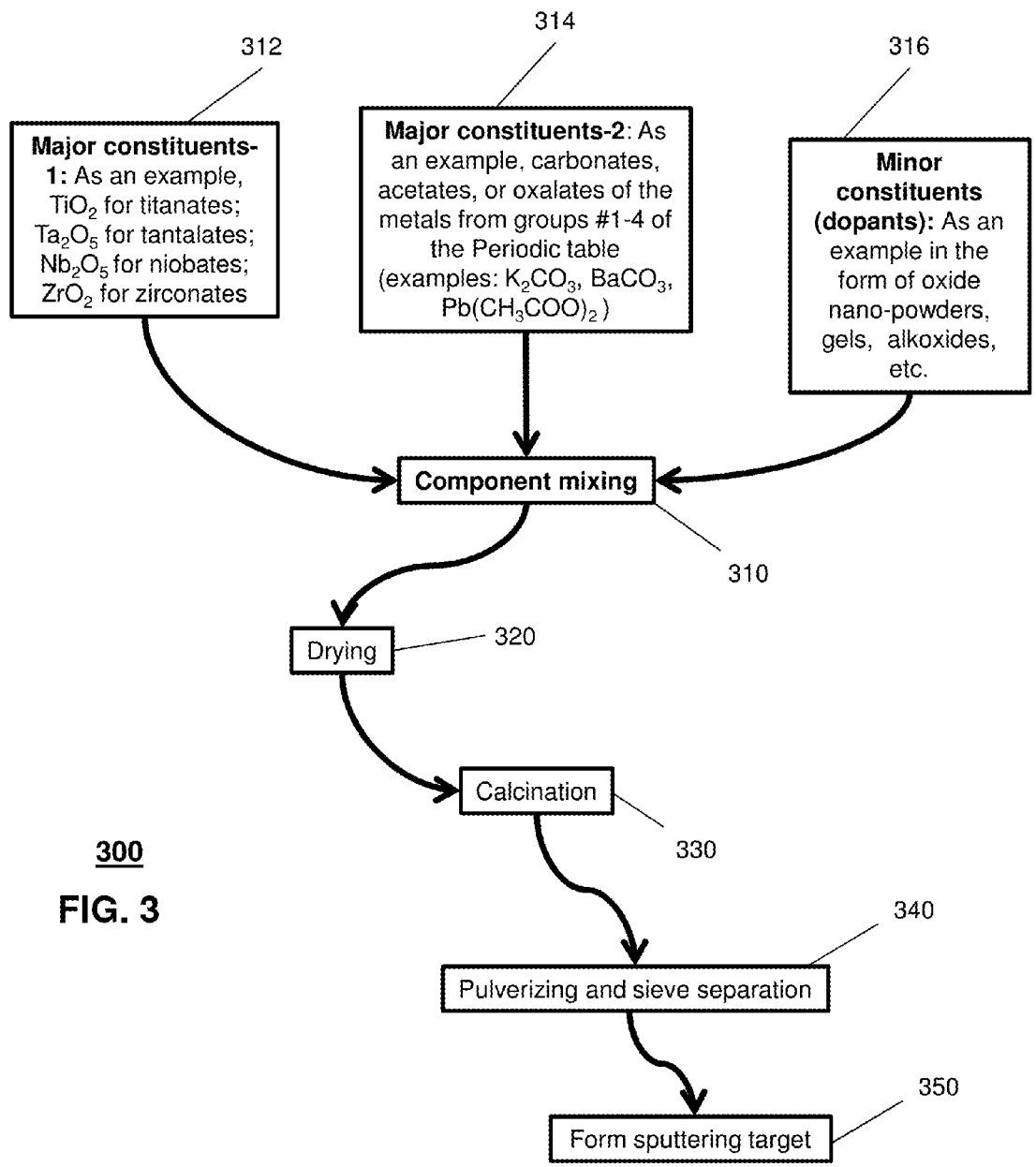
FIG. 3 depicts an exemplary method that can be used for fabricating the sputtering target of FIG. 2A.

Referring to FIG. 3, a method 300 is illustrated for fabricating a powder and forming a sputtering target from the powder. Method 300 can be utilized for forming sputtering target 200 and can be utilized for forming other sputtering targets that can be composed of various materials including BST, other titanates, and so forth. Method 300 is not intended to be limited to the steps illustrated in FIG. 3 and can include more or less steps than is depicted.

Method 300 can include mixing of various components at 310. The mixing can be a single mixing step and can be performed using various techniques including ball milling, vibrational milling and/or mechanical grinding, which may depend on the selected components. The components for mixing can be selected based on various criteria associated with the powder that will form the sputtering target. For example, the components can be selected based on thermal decomposition properties of one or more of the components, such as the thermal decomposition of a precursor of a major constituent satisfying a temperature threshold with respect to the crystallization temperature of the resulting powder. In the example of method 300, two major constituents and one minor constituent are being selected to form a powder that can be hot-pressed into a sputtering target for PVD deposition of a high K dielectric thin film.

The particular number and types of major and minor constituents can vary depending on the sputtering target that is to be formed. In this example of method 300, the first major constituent can be $TiO_2$ for titanates, $Ta_2O_5$ for tantalates, $Nb_2O_5$ for niobates and $ZrO_2$ for zirconates. Continuing with this example, the second major constituent can be carbonates, acetates, or oxalates of the metals from groups number 1-4 of the Periodic table (e.g., $K_2CO_3$, $BaCO_3$, and/or $Pb(CH_3COO)_2$). The minor constituents for this example of method 300 can be in the form of oxide nanopowders, gels, alkoxides, and so forth. Other major and/or minor constituents can also be utilized, including the other examples described throughout the present disclosure.

At 320, the mixture of constituents can be dried. The particular drying temperature (e.g., 130 C) and drying time (e.g., 6 hrs) can vary and can be selected based on the constituents that have been mixed together, the batch size, and the equipment used. At 330, the dried mixture of constituents can be calcinated. The particular calcination temperature (e.g., 1200° C.) and calcination time (e.g., 12 hrs) can vary and can be selected based on the constituents that have been mixed together and the desired sputtering target, such as a BST sputtering target.

At 340, the reacted mixture of constituents can be further processed to obtain the desired powder that will form the sputtering target. For example, the reacted mixture of constituents can be pulverized and separated (e.g., via a sieve separation technique). Other processing techniques for separation can also be utilized such as electrostatic, centrifugal and/or cyclonic separation.

In one embodiment at 350, a sputtering target can be formed from the powder using a hot-press method. The temperature, pressure and duration of the hot-press method can vary and can be based on the powder and/or the desired sputtering target to be formed. For example, a BST sputtering target can undergo a hot-press at a temperature of 1000 C to 2000 C. It should be understood that method 300 is but one example of a sputtering target that can be fabricated according to the exemplary embodiments, and the particular materials, temperatures, pressures, timing and so forth, can vary based on a number of factors including the desired sputtering target that is to be formed, a desired density of the sputtering target, and/or a desired deposition rate for the PVD process that will utilize the sputtering target. The exact fabrication method for the electrical components (e.g., capacitors) can be performed in various ways utilizing the exemplary sputtering target described herein, such as described in the above referenced US Patents.

In one or more embodiments, the sputtering target provides dielectric films for thin-film capacitors which exhibit improved physical density, improved dielectric strength. high tuning, and improved uniformity of capacitance, breakdown voltage and thickness.

One or more of the exemplary embodiments can be used for fabricating a sputtering target(s) used in a PVD sputtering process for producing dielectric layers of an electrical component (e.g., a voltage tunable variable capacitor), such as a high permittivity (High-K) dielectric perovskite or pyrochlore material of various stoichiometric or non-stoichiometric chemical compositions. The dielectric layers can be highly tunable. Examples include compounds containing Barium Strontium Titanium Oxide or $(BaSr)TiO_3$, SBT, SBM, PZT or PLZT, and doped formulations of each. Other electrically tunable dielectric materials may be used partially or entirely in place of BST. An example is strontium bismuth tantalate (SBT). Additional electronically tunable ferroelectrics can include other electrically tunable compositions of high-K dielectrics, such as $NaNO_3$, $KNbO_3$, $BaTiO_3$, $SrTiO_3$, $CaTiO_3$, members of the lead titanate family such as $PbTiO_3$, $Pb(ZrxTi_{1-x})O_3$ (PZT), $(Pb,Sr)(Zr_xTi_{1-x})O_3$, $(Pb,La)(ZxTi_{1-x})O_3$ (PLZT), niobate-tantalate family such as $LiTaO_3$, $PbNb_2O_6$, $KSr(NbO_3)$, $LiNbO_3$, $K(Ta_{1-x}Nbx)O_3$, $PbTa_2O_6$ KDP ($KH_2PO_4$) layered perovskites/Aurivillius phases such as $SrBi_2Ta_2O_9$, tungsten-bronze structures ($PbTa_2O_6$), phosphates such as $KH_2PO_4$ (KDP), fluorides such as $BaMgF_4$ including doped formulations, and mixtures or compositions thereof.

In other embodiments, additional minor additives (e.g., in amounts of from about 0.1 to about 10 weight percent) can be utilized in the electrical component to additionally improve the electronic properties, such as of the films. These minor additives can include various materials, such as $CaZrO_3$, $BaZrO_3$, $SrZrO_3$, $BaSnO_3$, $CaSnO_3$, $MgSnO_3$, $Bi_2O_{3/2}SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

In one or more embodiments, films of tunable dielectric composites may comprise $Ba_{1-x}Sr_xTiO_3$ (BST) (or other tunable dielectric), in combination with at least one non-tunable dielectric phase including Group 2A elements in the form of oxide, silicate, zirconate, aluminate, tantalate, niobate or a mixture of thereof. Examples include MgO, $MgTiO_3$, $MgZrO_3$, $MgSrZrO_6$, $Mg_2SiO_4$, $MgAl_2O_4$, CaO, $CaSiO_3$, $CaTiO_3$, $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$. These compositions can be BST (or other tunable dielectric) and one of these components, or two or more of these components in quantities from 0.1 weight percent to 10 weight percent with BST (or other tunable dielectric) weight ratios of 99.9 weight percent to 90 weight percent.

In addition to Group 2A metals, one or more of the exemplary embodiments can utilize metal oxides, silicates, zirconates, aluminates, tantalates, niobates or a combination thereof that include metals from Group 1A (alkali metals),e.g., Li, Na, K and Rb. For instance, alkali metal silicates may include sodium silicates such as $Na_2SiO_3$ and $NaSiO_3.5H_2O$, and lithium-containing silicates such as $LiAlSiO_4$, $Li_2SiO_3$ and $Li_4SiO_4$. Metals from Groups 3A, 4A and some transition metals of the Periodic Table may also be suitable constituents of the metal silicate phase. Additional oxides and silicates may include but not limited to $Al_2O_3$, $SiO_2$, $ZrO_2$, $Al_2Si_2O_7$, $ZrSiO_4$, $KAlSi_2O_6$, $NaAlSi_2O_6$, $CaAl_2Si_2O_8$, $CaMgSi_2O_6$, $BaTiSi_3O_9$ and $Zn_2SiO_4$. Metals from other Groups of the Periodic Table may also be suitable constituents of the metal oxide phases. For example, oxides and/or other compounds of refractory metals such as Ti, V, Cr, Mn, Zr, Nb, Mo, Hf, Ta, and W may be used. Furthermore, metals such as Al, Si, Sn, Pb, and Bi may be used in the form of oxides and/or other compounds. In addition, the metal oxide phases may comprise rare earth elements such as La, Ce, Pr, Nd, Pm, Sm, Eu, Gd, Tb, Dy, Ho, Er, Tm, Yb, Lu in the form of oxides and/or other compounds solely or in composition with one or more of the above mentioned additives.

In one or more embodiments, high-capacity or tunable monolithic thin film capacitors can be formed from the doped oxide films deposited from the target. These integrated capacitors require electrode layers and/or interconnects formed, for example, from a conductive thin-film material (e.g., Pt, conductive oxides such as $SrRuO_3$, $LaNiO_3$, $LaMn_{1-x}Co_xO_3$, and other metals such as Ir, Au, Cu, and W). The electrode layers could be a single metal, or a multilayer structure comprised of two or more metals or combinations of metals with conductive oxides. These multilayer structures could include conductive barriers, such as but not limited to $Ti_xN_y$, TiW, $Ta_xN_y$, $Ta_x(ON)_y$, and anti-reflective layers.

Other uses for the invention include multi-component dielectric films deposited by the sputtering method for optical coatings and transparent conductive films for electro-optical devices or components.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method, comprising:
   selecting a first major constituent, a second major constituent and at least one minor constituent, wherein the first major constituent is $Ta_2O_5$, wherein the second major constituent is one of $BaCO_3$ or $Pb(CH_3COO)_2$, and wherein the minor constituent is selected from a group consisting of a nanopowder, a gel, an alkoxide or combinations thereof;
   forming a mixture of constituents consisting essentially of the first major constituent, the second major constituent and the minor constituent in a single mixing step;
   drying the mixture of constituents to provide a dried mixture of constituents;
   calcining the dried mixture of constituents to provide a fully reacted mixture of constituents;
   pulverizing and separating the reacted mixture of constituents to provide a powder of constituents;
   hot-pressing the powder of constituents to form a target; and
   performing physical vapor deposition using the target to form a multicomponent dielectric thin film,
   wherein the physical vapor deposition is performed at a deposition rate between nine nanometers per minute and eighteen nanometers per minute, and wherein the target has a density of at least 99%.

2. The method of claim 1, wherein the second major constituent is $Pb(CH_3COO)_2$.

3. The method of claim 1, wherein the calcining is performed within 100 C of the temperature of solid state reaction of the constituents.

4. The method of claim 1, wherein the second major constituent is $BaCO_3$.

5. The method of claim 1, wherein the nanopowder is selected from a group consisting essentially of a rare-earth metal oxide nanopowder, a hydroxide nanopowder, a titanate nanopowder, a zirconate nanopowder, a niobate nanopowder or combinations thereof, and wherein the alkoxide is selected from a group consisting essentially of magnesium ethoxide, aluminum isopropoxide, rare-earth alkoxide, hydroxyacetate, hydroxyoxalate, hydroxypropionate and combinations thereof.

6. A method, comprising:
   selecting a first major constituent, a second major constituent and at least one minor constituent, wherein the first major constituent is $ZrO_2$, wherein the second major constituent is one of BaCO₃ or Pb(CH₃COO)₂, and wherein the minor constituent selected from a group consisting of a nanopowder, a gel, an alkoxide or combinations thereof;

forming a mixture of constituents consisting essentially of the first major constituent, the second major constituent and the minor constituent in a single mixing step;

drying the mixture of constituents to provide a dried mixture of constituents;

calcining the dried mixture of constituents to provide a fully reacted mixture of constituents;

pulverizing and separating the reacted mixture of constituents to provide a powder of constituents;

hot-pressing the powder of constituents to form a target; and performing physical vapor deposition using the target to form a multicomponent dielectric thin film, wherein the physical vapor deposition is performed at a deposition rate of at least twelve nanometers per minute, and wherein the target has a density of at least 99%.

7. The method of claim 6, wherein the second major constituent is BaCO₃.

8. The method of claim 6, wherein the calcining is performed within 100 C of the temperature of solid state reaction of the constituents.

9. The method of claim 6, wherein the second major constituent is Pb(CH₃COO)₂.

10. The method of claim 6, wherein the nanopowder is selected from a group consisting essentially of a rare-earth metal oxide nanopowder, a hydroxide nanopowder, a titanate nanopowder, a zirconate nanopowder, a niobate nanopowder or combinations thereof, and wherein the alkoxide is selected from a group consisting essentially of magnesium ethoxide, aluminum isopropoxide, rare-earth alkoxide, hydroxyacetate, hydroxyoxalate, hydroxypropionate and combinations thereof.

11. A method, comprising:

selecting a first major constituent, a second major constituent and at least one minor constituent, wherein the first major constituent is selected from a group consisting of TiO₂, Ta₂O₅, or ZrO₂, wherein the second major constituent is one of BaCO₃ or Pb(CH₃COO)₂, and wherein the minor constituent is selected from a group consisting of a nanopowder, a gel, an alkoxide or combinations thereof;

forming a mixture of constituents consisting essentially of the first major constituent, the second major constituent and the minor constituent in a single mixing step;

drying the mixture of constituents to provide a dried mixture of constituents;

calcining the dried mixture of constituents to provide a fully reacted mixture of constituents; and pulverizing and separating the reacted mixture of constituents to provide a powder of constituents.

12. The method of claim 11, wherein the second major constituent is Pb(CH₃COO)₂.

* * * * *